(12) United States Patent
Kim et al.

(10) Patent No.: US 9,620,844 B2
(45) Date of Patent: Apr. 11, 2017

(54) CONNECTOR JOINT SUPPORT MODULE, ELECTRONIC DEVICE INCLUDING THE SAME, AND METHODS OF ASSEMBLING AND DISASSEMBLING ELECTRONIC DEVICE

(71) Applicant: Samsung Electronics Co., Ltd., Gyeonggi-do (KR)

(72) Inventors: Hyunjoong Kim, Gyeonggi-do (KR); Youngmin Kang, Gyeonggi-do (KR); Jaewoo Lee, Seoul (KR); Jongsik Kim, Gyeonggi-do (KR); Kwangsoo Han, Gyeonggi-do (KR); Juho Yi, Gyeonggi-do (KR)

(73) Assignee: SAMSUNG ELECTRONICS CO., LTD, Suwon-si, Gyeonggi-Do (KR)

( * ) Notice: Subject to any disclaimer, the term of this patent is extended or adjusted under 35 U.S.C. 154(b) by 161 days.

(21) Appl. No.: 14/210,013

(22) Filed: Mar. 13, 2014

(65) Prior Publication Data

US 2014/0273632 A1 Sep. 18, 2014

Related U.S. Application Data

(60) Provisional application No. 61/780,651, filed on Mar. 13, 2013.

(30) Foreign Application Priority Data

Jun. 3, 2013 (KR) ........................ 10-2013-0063557

(51) Int. Cl.
*H01R 13/60* (2006.01)
*H01Q 1/12* (2006.01)
(Continued)

(52) U.S. Cl.
CPC ............... *H01Q 1/12* (2013.01); *H01Q 1/243* (2013.01); *H04M 1/0274* (2013.01);
(Continued)

(58) Field of Classification Search
CPC .......... H01R 13/65802; H01R 23/6873; H01R 13/6587; H01R 13/514; H01R 12/712; H01R 13/518; H01R 13/6596
See application file for complete search history.

(56) References Cited

U.S. PATENT DOCUMENTS 4,875,140 A * 10/1989 Delpech .................. H05K 7/142
174/138 D
4,948,374 A * 8/1990 Carter .................... H01R 12/62
439/329
(Continued)

*Primary Examiner* — Xuong Chung Trans

(57) ABSTRACT

A connector joint support module includes a boss including at least one projection; a connector joint disposed in an area adjacent to the boss, and a bracket disposed to be engaged with the boss while covering at least a portion of the connector joint. An electronic device includes a boss including at least one projection, a connector joint disposed in an area adjacent to the boss, a bracket disposed to be engaged with the boss and to cover at least a portion of the connector joint, a screw recess formed in a female screw shape at a center of the projection of the boss, an antenna carrier or a rear frame disposed to enclose the bracket, and a screw passing through one side of the antenna carrier or the rear frame and engaged with the screw recess of the boss.

18 Claims, 20 Drawing Sheets

(51) Int. Cl.
   *H05K 5/02*     (2006.01)
   *H01Q 1/24*     (2006.01)
   *H04M 1/02*     (2006.01)

(52) U.S. Cl.
   CPC ...... *H05K 5/0247* (2013.01); *Y10T 29/49208* (2015.01); *Y10T 403/591* (2015.01); *Y10T 403/70* (2015.01)

(56) References Cited

U.S. PATENT DOCUMENTS

| | | | | |
|---|---|---|---|---|
| 5,421,402 | A * | 6/1995 | Lin | F28D 1/024 |
| | | | | 165/121 |
| 5,755,586 | A * | 5/1998 | Knighton | H01R 12/7005 |
| | | | | 439/328 |
| 5,775,946 | A * | 7/1998 | Briones | H01R 23/6873 |
| | | | | 439/607.25 |
| 6,062,911 | A * | 5/2000 | Davis | H01R 13/2492 |
| | | | | 439/630 |
| 6,168,466 | B1 * | 1/2001 | Chiou | H01R 24/64 |
| | | | | 439/607.02 |
| 6,582,240 | B2 * | 6/2003 | Suto | H05K 3/301 |
| | | | | 439/79 |
| 6,793,531 | B1 * | 9/2004 | Zhang | H01R 13/506 |
| | | | | 439/607.04 |
| 7,901,221 | B1 * | 3/2011 | Li | H01R 13/65802 |
| | | | | 439/607.28 |
| 8,702,441 | B2 * | 4/2014 | Farahani | G06F 1/1656 |
| | | | | 439/345 |

* cited by examiner

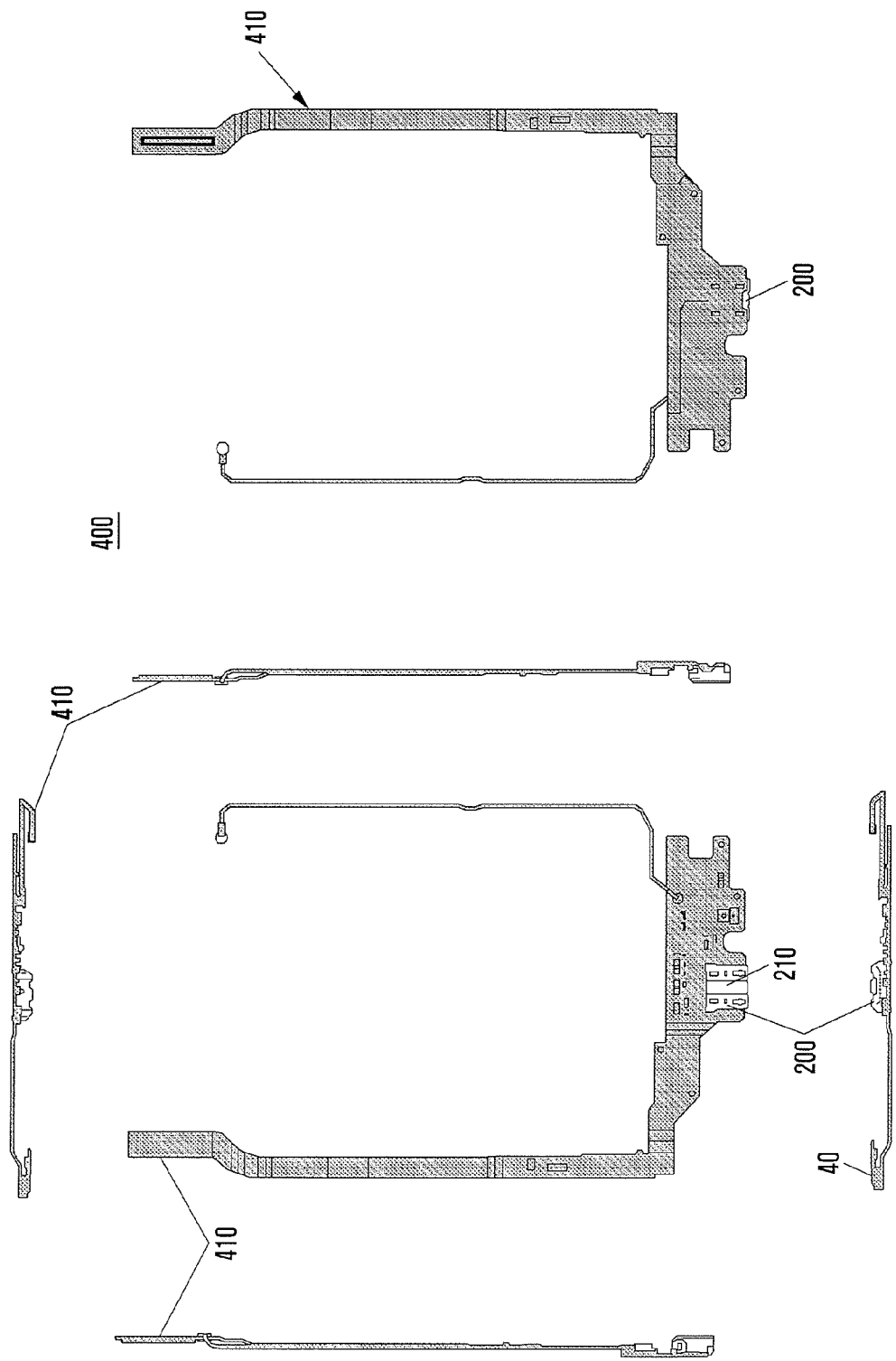

CONNECTOR JOINT SUPPORT MODULE, ELECTRONIC DEVICE INCLUDING THE SAME, AND METHODS OF ASSEMBLING AND DISASSEMBLING ELECTRONIC DEVICE

CROSS-REFERENCE TO RELATED APPLICATIONS AND CLAIM OF PRIORITIES

The present application is related to and claims the benefit under 35 U.S.C. §119(e) of a U.S. Provisional application Ser. No. 61/780,651 filed on Mar. 13, 2013 in the U.S. Patent and Trademark Office, and under 35 U.S.C. §119(a) of a Korean patent application No. 10-2013-0063557 filed on Jun. 3, 2013 in the Korean intellectual property office, the entire disclosure of each of which are hereby incorporated by reference.

TECHNICAL FIELD

The present disclosure relates to a connector joint structure of an electronic device, connector joint support module, electronic device including the same, and methods of assembling and disassembling electronic device including a connector joint support module.

BACKGROUND

In recent years, electronic devices have supported complex management of various user functions through development of hardware technologies. The electronic devices can reproduce stored information. The electronic devices can form communication channels with external electronic devices or server devices, and can receive and output information provided by the external electronic devices and the server devices.

The electronic devices may be connected to the external devices through cables. The electronic devices may therefore have structures for connection of cables. A physical force may be consistently applied to a cable connection structure in a process of detaching a cable. Accordingly, the cable connection structure of the electronic structure may be damaged.

SUMMARY

To address the above-discussed deficiencies, it is a primary object to provide a connector joint support module having an improved connector joint structure, and an electronic device including the same.

In accordance with an aspect of the present disclosure, a connector joint support module includes a boss including at least one projection, a connector joint disposed in an area adjacent to the boss, and a bracket disposed to be engaged with the boss and cover at least a portion of the connector joint.

In accordance with another aspect of the present disclosure, an electronic device is provided. The electronic device includes a boss including at least one projection, a connector joint disposed in an area adjacent to the boss, a bracket disposed to be engaged with the boss while covering at least a portion of the connector joint, a screw recess formed in a female screw shape at a center of the projection of the boss, an antenna carrier or a rear frame disposed to enclose the bracket, and a screw passing through one side of the antenna carrier or the rear frame and engaged with the screw recess of the boss.

In accordance with another aspect of the present disclosure, a method of assembling an electronic device is provided. The method includes disposing at least one boss, disposing a connector joint in a peripheral area of the boss, and engaging a bracket with the boss while covering at least a portion of the connector joint with the bracket.

In accordance with another aspect of the present disclosure, a method of disassembling an electronic device is provided. The method includes disposing at least one boss, disposing a connector joint in a peripheral area of the boss, engaging a bracket with a projection included in the boss through hook-coupling while covering at least a portion of the connector joint with the bracket, and removing a wing part of the bracket from the projection of the boss by using an extraction hole formed in the bracket.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 3A and 3B illustrate configurations of a hardware board module of the electronic device of FIG. 1 in detail;

DETAILED DESCRIPTION

Figure 1:
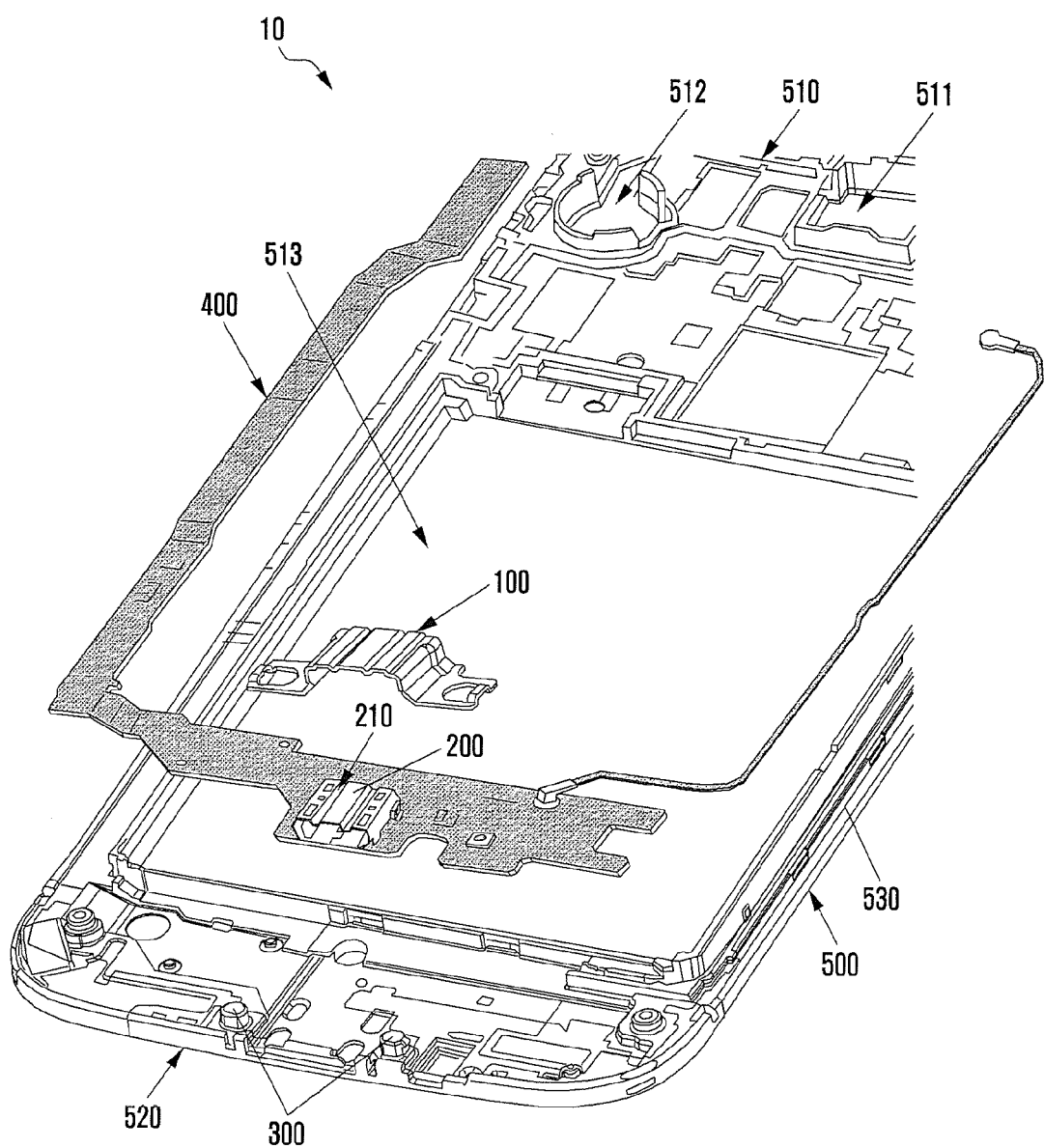
FIG. 1 illustrates some components of an electronic device including a connector joint support module in accordance with an embodiment of the present disclosure.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged mechanical and/or electronic devices. Hereinafter, exemplary embodiments of the present disclosure will be described in detail with reference to the accompanying drawings.

In a description of the embodiment of the present disclosure, technical contents that are well known in the technical field to which the present disclosure pertains but are not directly relevant to the present disclosure will not be described. Further, a detailed description of a configuration of the present disclosure will be omitted herein when it may make the essence of the present disclosure obscure.

For the same reason, some constituent elements are exaggerated, omitted or schematically illustrated in the accompanying drawings and the sizes of the constituent elements do not totally reflect their actual sizes. Thus, the present disclosure is not limited by relative sizes or separations drawn in the accompanying drawings.

In the following description, the connector joint support module of the present disclosure may include bosses in the form of projections, a connector joint disposed between the bosses, and a bracket disposed to cover the connector joint. In addition, the connector joint support module may include some structures of a front mechanism in which the bosses may be provided, and a hardware board module in which the connector joint is disposed.

Although it will be described that the bosses are disposed in the front mechanism, the bosses may be moved from a predetermined area of the front mechanism to another area or may be formed in a structure other than the front mechanism according to an intention of a designer to change a design. In addition, the boss may be disposed independently from the front mechanism to be coupled to the front mechanism or another structure of the electronic device.

Similarly, the connector joint may be directly disposed in the front mechanism in which circuit lines are formed or may be directly disposed in the bosses in which circuit lines are formed. Consequently, when the bosses and the connector joint constitute the electronic device, the disposition thereof is so variable that the connector joint support module of the present disclosure may include the bosses, the connector joint, and the bracket; and other variable structures should not limit the technology of the present disclosure.

In addition, it will be described that the electronic device employing the connector joint support structure of the present disclosure may employ a pressing structure of the bracket based on an antenna carrier or a rear frame as a means of reinforcing the bracket support structure in addition to the above-described structures. However, the electronic device applied to the present disclosure is not limited to the following components. That is, it should be understood that the technology of the present disclosure can be applied to any electronic device that can employ the connector joint support structure of the present disclosure even if neither the antenna carrier nor the rear frame is separately provided or one of them is provided.

Figure 2:
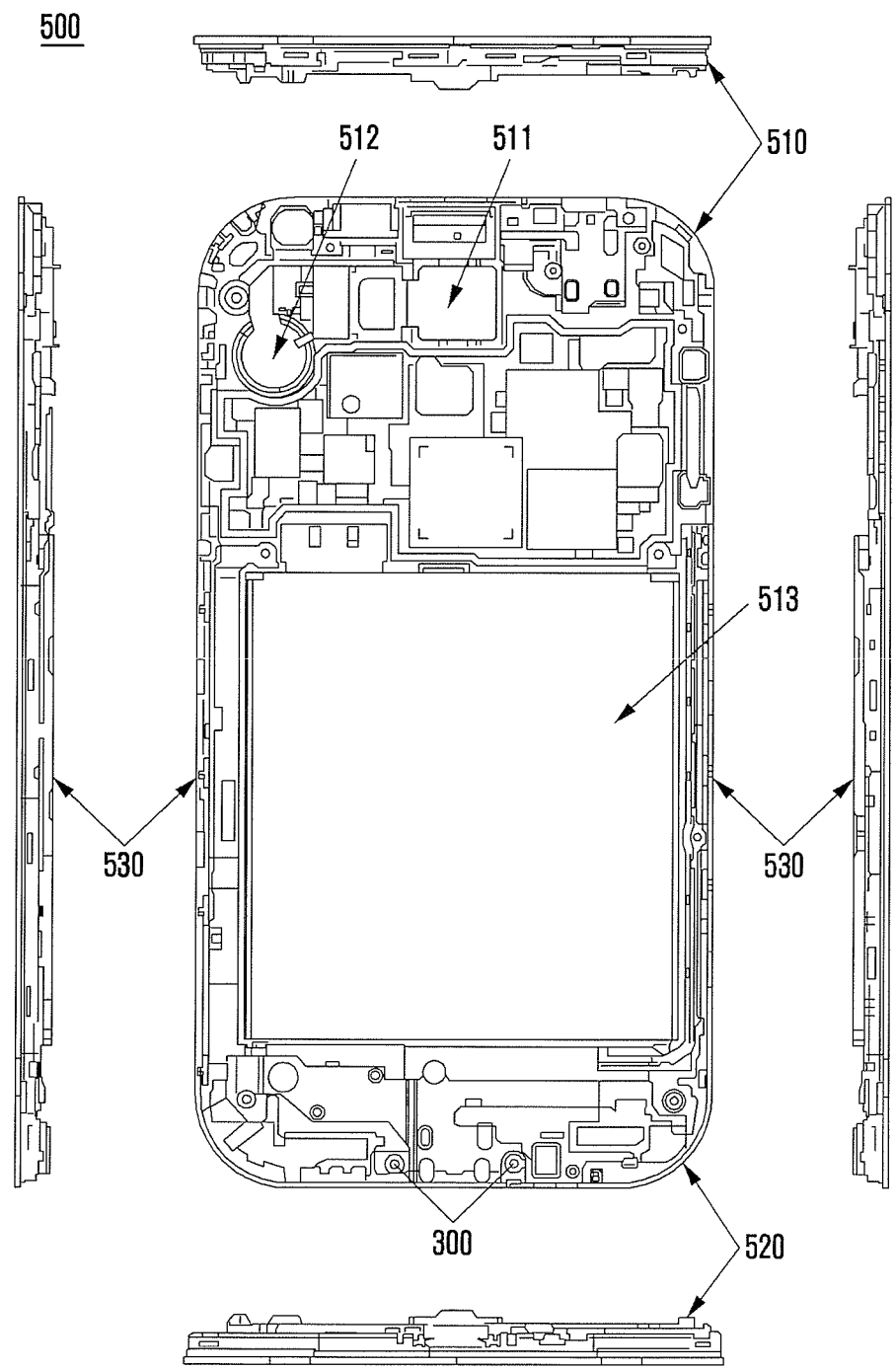
FIG. 2 illustrates a front mechanism of the electronic device of FIG. 1 in detail.
Figure 3B:
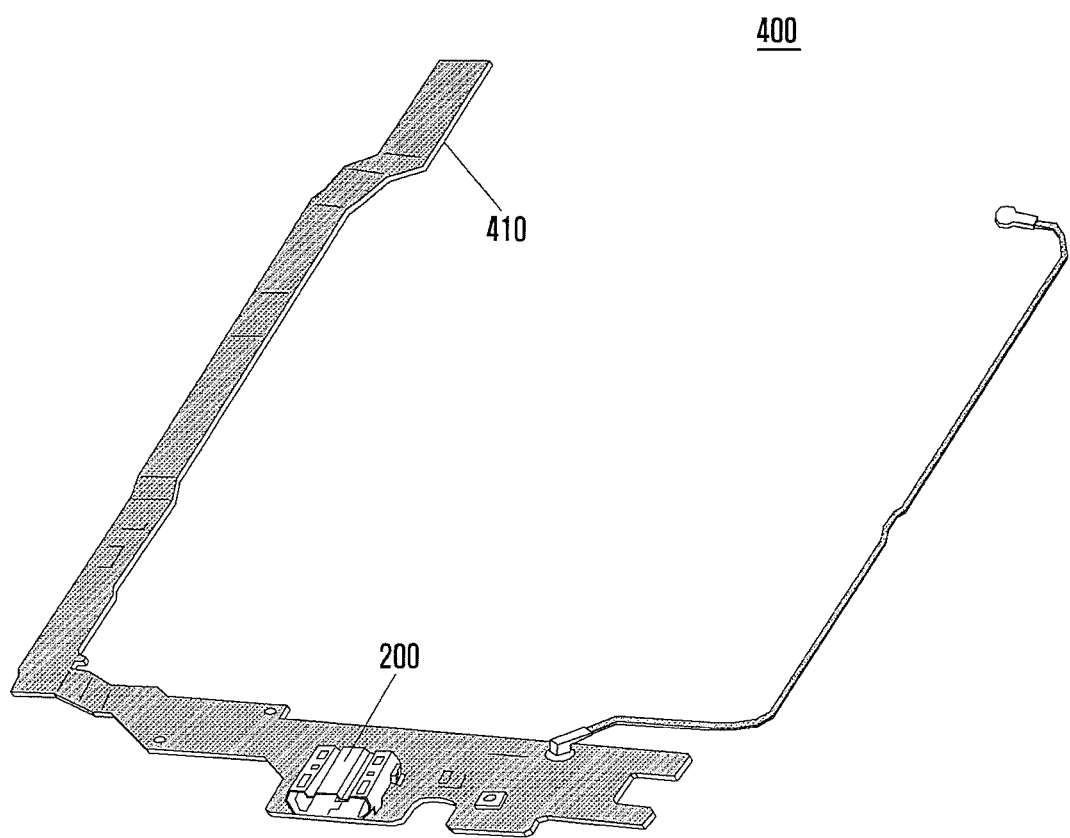
Figure 4A:
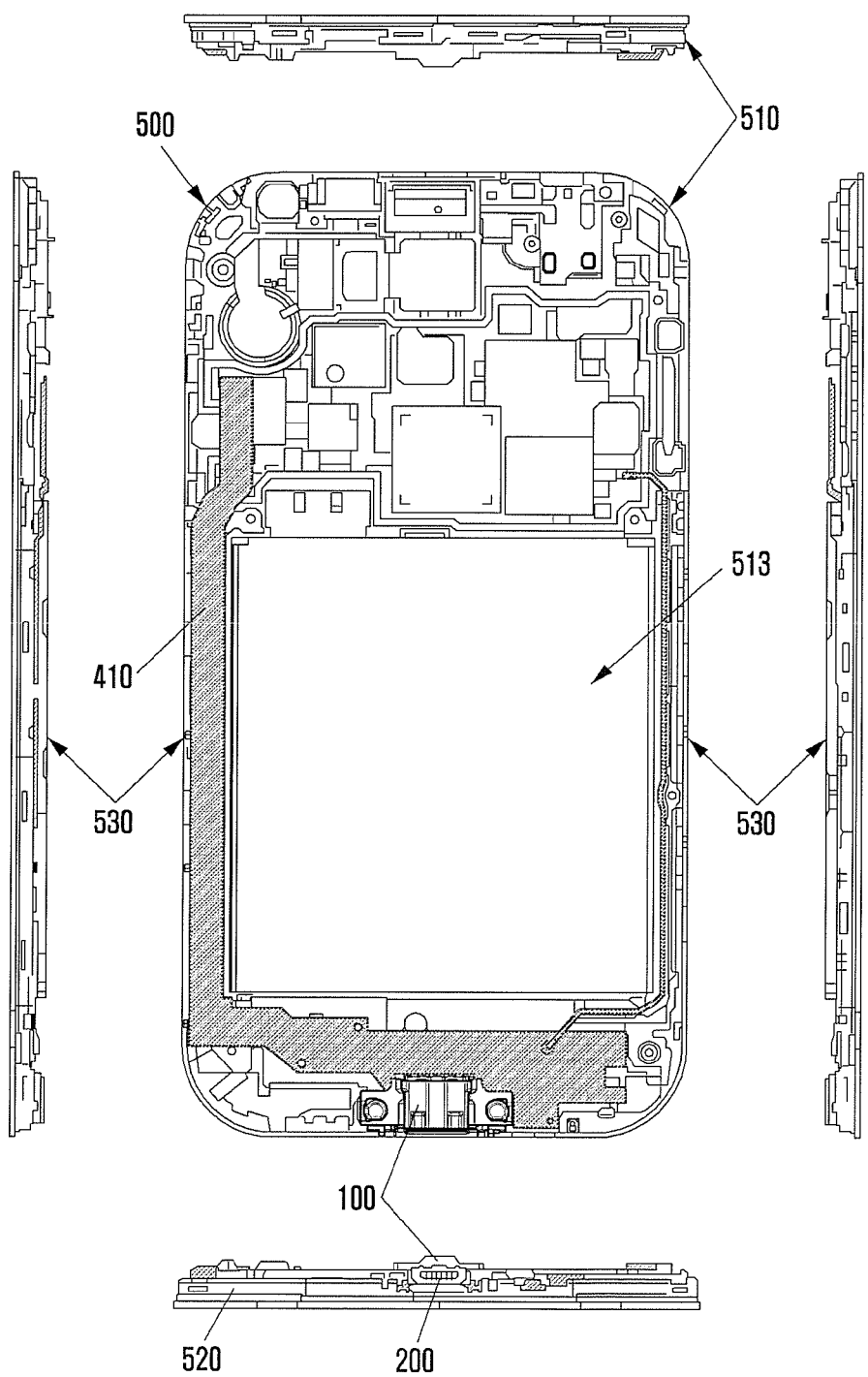
FIGS. 4A and 4B illustrate coupling of the front mechanism and the hardware board module to each other.
Figure 4B:
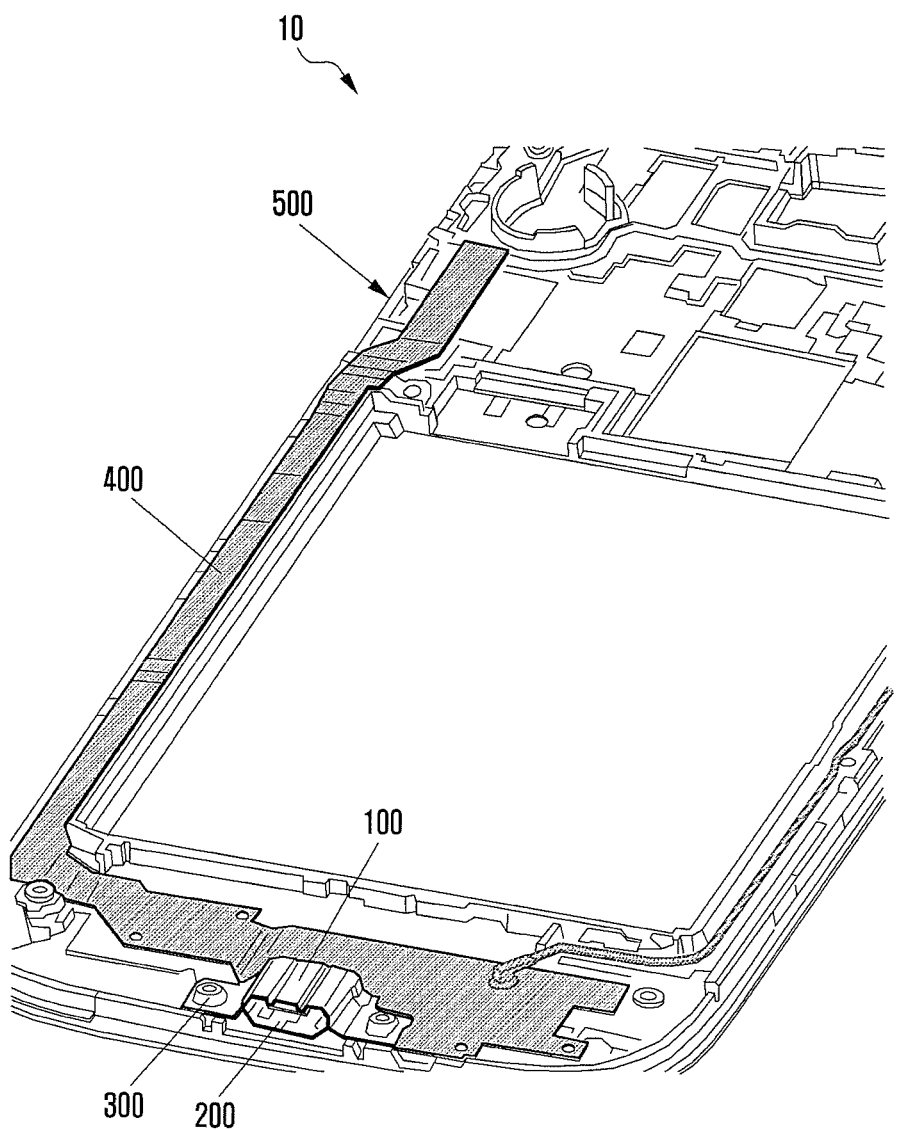

FIG. 1 is an exploded perspective view illustrating some components of an electronic device to which a connector joint support module is applied in accordance with an embodiment of the present disclosure. FIG. 2 illustrates a front view, left and right side views, and top and bottom views of a front mechanism in accordance with the embodiment of the present disclosure. FIGS. 3A and 3B illustrate a front view, left and right side views, top and bottom views, and a perspective view of a hardware board module. FIGS. 4A and 4B illustrate an assembled state of some components of the electronic device.

Referring to FIG. 1, structures related to support of a connector joint of an electronic device 10 in accordance with the embodiment of the present disclosure can include an area of a front mechanism 500 and an area of a hardware board module 400. The electronic device 10 can further include a display module disposed on a front surface of the front mechanism 500, a rear frame covering an upper portion of the hardware board module 400, and a battery cover.

The front mechanism 500 can have a circular or polygonal shape, for example, a rectangular shape. The front mechanism 500 can have a plastic or metallic structure. At least a portion of the front mechanism 500 can be formed of a nonmetallic material, for example, wood, rubber, or reinforced rubber. As illustrated in FIGS. 1, 2, 4A, and 4B, the front mechanism 500 can include an upper end 510 and a lower end 520 that are rectangular, and lateral sides 530 connecting opposite peripheries of the upper end 510 and the lower end 520. A central area provided according to disposition of the upper end 510, the lower end 520, and the lateral sides 530 can form a battery positioning space 513 in which a battery can be positioned. The upper end 510 can include various structures such as a camera positioning space 513 in which a camera module can be positioned, and a speaker positioning part 512 in which a speaker can be disposed. The hardware board module 400 can be positioned on the lateral sides 530 and the lower end 520 of the front mechanism 500. The shape of the front mechanism 500 can be variously modified according to an intention of a designer.

The lower end 520 can include an area in which a connector joint 200 of the hardware board module 400 is disposed. Thereto, the lower end 520 can have an area in which the hardware board module 400 is recessed with respect to the peripheral area. A boss 300 can be provided at a periphery of the area of the lower end 520 in which the connector joint 200 is disposed.

The boss 300 can be provided at various locations according to disposition of the connector joint 200. For example, the boss 300 can be disposed in an edge area of the lower end 520. The boss 300 can be disposed at a lower periphery of the edge of the lower end 520. Two bosses 300 can be disposed at opposite peripheries of the edge of the lower end 520. The boss 300 can be provided in a predetermined area of the front mechanism 500 according to an area in which the connector joint 200 is disposed in the hardware board module 400. For example, the boss 300 can be disposed in an edge area of the lateral sides 530. The boss 300 can be disposed in an edge area of the upper end 510.

The boss 300 can have at least one projection protruding from a surface of the lower end 520 by a predetermined height. Two bosses 300 are illustrated in the drawings. However, the present disclosure is not limited thereto. That is, the boss 300 can have one projection and can have two or more projections if necessary. The boss 300 can have a projection, an upper portion of which is closed. An interior of the closed projection can be solid or empty. The boss 300 can have a hole in which a female thread is vertically formed for screw-coupling. The boss 300 can be formed of the same material as that of the front mechanism 500. Further, the boss 300 can be formed of a metallic material.

Referring to FIGS. 1, and 3A to 4B, the hardware board module 400 can include a printed circuit board 410, a connector joint 200, and a bracket 100.

The printed circuit board 410 can be formed of a dielectric material. The printed circuit board 410 can include a copper foil circuit pattern formed on the dielectric material. The printed circuit board 410 can be disposed on the front mechanism 500. Accordingly, the printed circuit board 410 can have a shape corresponding to the shape of the front mechanism 500. For example, the printed circuit board 410 can include a lower end board positioned at the lower end 520, and side boards positioned on the lateral sides 530 at opposite peripheries of the lower board. The connector joint 200 can be disposed on the lower end board. The printed circuit board 410 can include a circuit pattern connected to the connector joint 200. The printed circuit board 410 can have at least one recess or hole into which at least a portion of the connector joint 200 can be inserted so that the connector joint 200 can be firmly coupled to the printed circuit board 410 in the process of disposing the connector joint 200.

The connector joint 200 can be disposed on the printed circuit board 410. For example, the connector joint 200 can be disposed at an edge area of the printed circuit board 410. One surface of the connector joint 200 can be aligned with a peripheral area of the printed circuit board 410. For example, a section of an opening of the connector joint 200 can be aligned with a periphery of the printed circuit board 410. The connector joint 200 can be variously provided according to a shape of an inserted cable terminal. The connector joint 200 can be formed of a metallic material for connection to electrical signals or electric power. Further, at least a portion of the connector joint 200 can be formed of a metallic material to transfer electrical signals or electric power to a cable terminal. The connector joint 200 can be electrically connected to the printed circuit board 410. The connector joint 200 can have a size similar to an external size of the cable terminal so that the cable terminal can be interference-fitted into the connector joint 200. The connector joint 200 can have a tubular shape, a front side and a rear side of which are open. The connector joint 200 can have at least one rail groove 210 so that the cable terminal can be easily inserted into and separated from the connector joint 200. For example, the rail groove 210 can be provided in a ceiling area of the connector joint 200.

The bracket 100 can be provided to enclose an outside of the connector joint 200. The bracket 100 can have an interior similar to an external shape of the connector joint 200. The bracket 100 can be a bent plate member having a predetermined length to enclose the outside of the connector joint 200. The bracket 100 can be formed of a metallic material to maintain strength. Further, the bracket 100 can be formed of reinforced plastic that can provide strength. The bracket 100 can be formed of a resilient material.

A structure of the bracket 100 will be described in more detail with reference to FIGS. 5A to 5C.

Figure 5A:
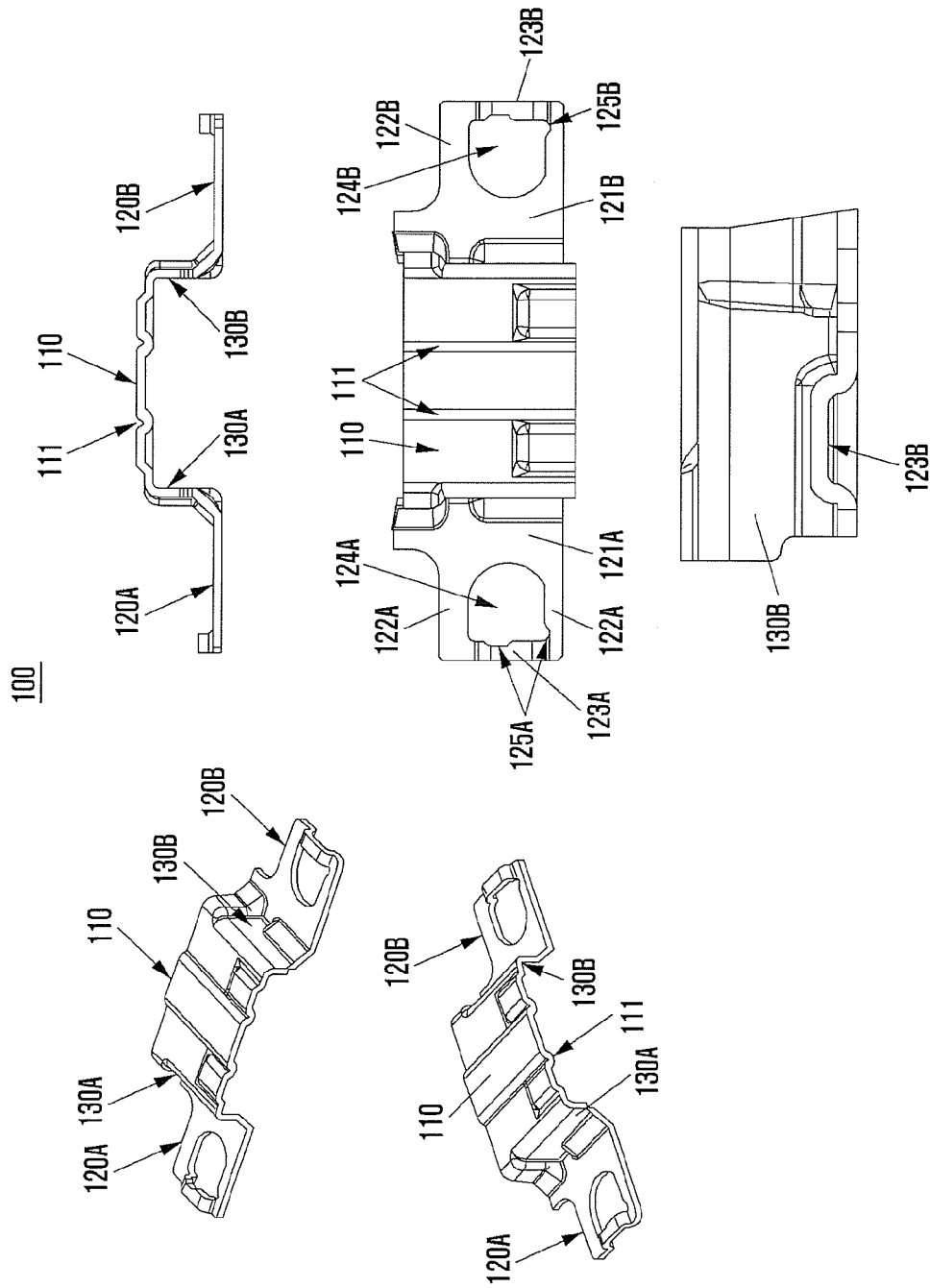
FIGS. 5A to 5C illustrate configurations of a bracket of the electronic device of FIG. 1 in detail.
Figure 5B:
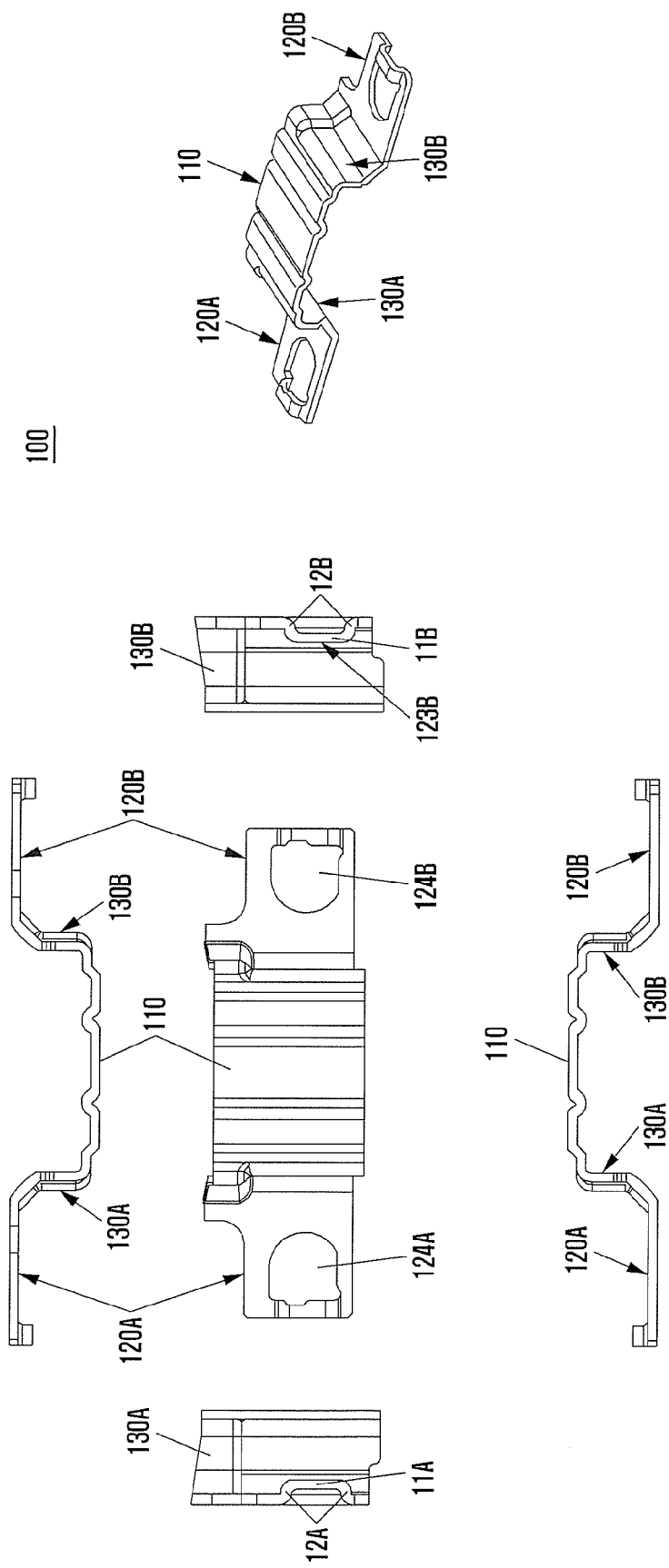
Figure 5C:
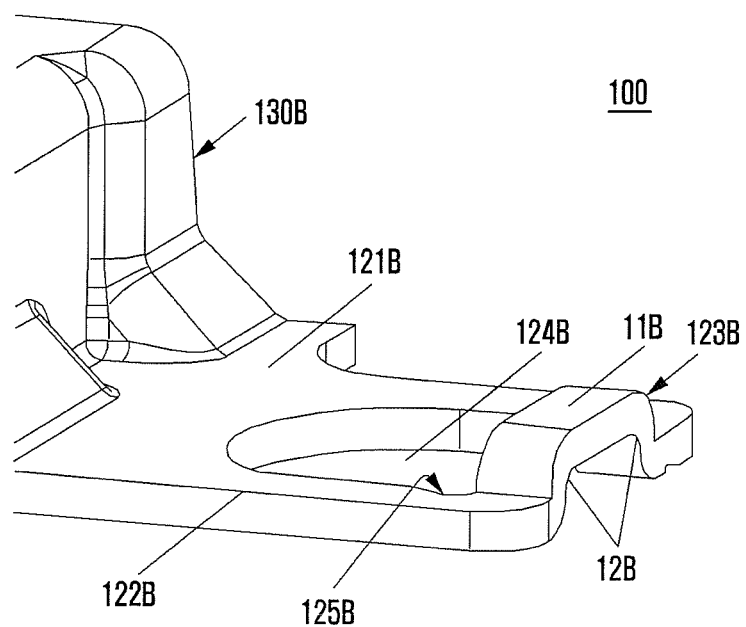
Figure 5C:
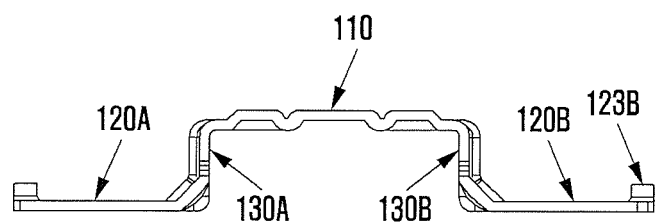

FIGS. 5A to 5C illustrate the structure of the bracket in accordance with the embodiment of the present disclosure in more detail, and illustrate front and rear views, left and right views, top and bottom views, and a perspective view.

Referring to FIGS. 5A to 5C, the bracket 100 in accordance with the embodiment of the present disclosure can include a cover part 110, column parts 130A and 130B, and wing parts 120A and 120B.

The cover part 110 of the bracket 100 can have not more than a predetermined area to maximally secure antenna performance. A wing part 120 functioning as a bridge to engage the cover part 110 with a peripheral structure, for example, a hook 310 of the boss 300 is formed at a periphery of the cover part 110, and a connecting portion 121 is formed at a portion of the wing part 120. The bracket 100 is generally manufactured by stainless steel pressing, and the connecting portion 121 can have various shapes according to a material, a shape, a location, and a fixing method of a counterpart object, for example, the boss. In addition to stainless steel, various materials, for example, copper, an aluminum alloy containing magnesium, can be used for the bracket 100, and a reinforced plastic can be used.

The cover part 110 can be a plate member having a predetermined thickness and a predetermined area. The cover part 110 can have a size similar to that of an upper surface of the connector joint 200. The cover part 110 can have a size smaller than that of an upper surface of the connector joint 200. The cover part 110 can cover the connector joint 200 and have a rail 111 so that the connector joint 200 can be more firmly retained on the printed circuit board 410 and the front mechanism 500. The rail 111 can be provided to protrude from a bottom surface of the cover part 110 towards the connector joint 200. Although two rails 111 are provided at central portions of the cover part 110 and two rails 111 are provided at opposite peripheries of the cover part 110 in the drawings, the present disclosure is not limited to thereto. That is, the cover part 110 can have a smaller number of rails 111 or can have a greater number of rails 111. Since the cover part 110 has rails 111 in the shape of folds, a predetermined resilient force can be applied to the connector joint 200.

The column parts 130A and 130B can include a first column part 130A perpendicularly connected to one periphery of the cover part 110, and a second column part 130B perpendicularly connected to an opposite periphery of the cover part 110. The first column part 130A and the second column part 130B can have the same height. The first column part 130A and the second column part 130B can be larger than a thickness of the connector joint 200. Connecting portions of the first column part 130A and the second column part 130B, and the cover part 110, can be rounded. The first column part 130A can be perpendicularly connected to the first wing part 120A. A connecting portion of the first column part 130A and the first wing part 120A can be rounded. The second column part 130B can be perpendicularly connected to the second wing part 120B. A connecting portion of the second column part 130B and the second wing part 120B can be rounded. The first column part 130A and the second column part 130B can have steps. Accordingly, the cover part 110 and the wing parts 120A and 120B connected to the first column part 130A and the second column part 130B also can be connected to the column parts 130A and 130B in a state in which the cover part 110 and the wing parts 120A and 120B are curved in the stepped areas of the column parts 130A and 130B.

The wing parts 120A and 120B can include a first wing part 120A connected to the first column part 130A and a second wing part 120B connected to the second column part 130B. The first wing part 120A and the second wing part 120B can be symmetrical to each other with respect to a central longitudinal axis of the cover part 110. The first wing part 120A can include a first plate member 121A perpendicularly connected to the first column part 130A and having a predetermined area, first guide portions 122A extending from opposite peripheries of the first plate member 121A and having a predetermined thickness, and a first catching portion 123A connecting ends of the first guide portions 122A.

The first catching portion 123A can include first catching walls 12A connected to the first guide portions 122A and extending from sides of the guide portions 122A perpendicularly to front surfaces of the first guide portions 122A, and a first connecting portion 11A connecting the first catching walls 12A. The first connecting portion 11A can be disposed at a height different from those of the guide portions 122A due to the catching walls 12A. The first wing part 120A can have a boss hole 124A defined by the first plate member 121A, the first guide portions 122A and the first catching portion 123A. First extraction hole 125A can be provided at least one side of the first guide portions 122A and at least one side of the first catching portion 123A, which face the first boss hole 124A. The projection included in the boss 300 can be inserted into one of the first extraction holes 125A.

The second wing part 120B can have the same shape as that of the first wing part 120A. For example, the second wing part 120B can include a second plate member 121B, second guide portions 122B, and a second catching portion 123B. Accordingly, the second wing part 120B can have a second boss hole 124B defined by the second plate member 121B, the second guide portions 122B, and the second catching portion 123B. At least one second extraction hole 125B can be provided at a periphery of the second boss hole 124B of the second wing part 120B. The extraction hole can be provided in at least one of the first wing part 120A and the second wing part 120B. That is, the first extraction hole 125A can be formed only in the first wing part 120A or the second extraction hole 125B can be formed only in the second wing part 120B. The projection included in the boss 300 can be inserted into the second extraction hole 125B. The second catching portion 123B can include second catching walls 12B and a second connecting portion 11B.

The first wing part 120A and the second wing part 120B of the bracket 100 can receive the bosses 300. In this process, the cover part 110 and the column parts 130A and 130B of the bracket 100 enclose the upper surface and side surfaces of the connector joint 200. Accordingly, the bracket 100 can prevent movement of the connector joint 200. When mechanisms are moved through a process after the connector joint 200 is temporarily installed on the printed circuit board 410 or temporarily installed in the front mechanism 500, the bracket 100 can support the connector joint 200 so that the connector joint 200 cannot be separated from the printed circuit board 410. The bracket 100 also can serve to fix the printed circuit board 410 so that the printed circuit board 410 cannot be easily separated from the front mechanism 500. Since the extraction holes are provided in the wing parts 120A and 120B of the bracket 100, the bracket 100 can be easily separated from the boss 300 if necessary. The catching portion formed in the bracket 100 is disposed at a height higher than the height of the guide portions by a predetermined distance, therefore the boss 300 can be coupled more easily. The catching portion of the bracket 100 also can improve engaging force with the boss 300.

The connecting portion 121 formed in the bracket 100 and the boss 300 formed in a peripheral structure can be hook-coupled to each other. The bracket 100 can be formed of a metal and the boss 300 also can be formed of a metal. The hook-coupling of the bracket 100 and the boss 300 can provide effects such as strength or waterproofing. A hook 310 provided in the boss 300 can be formed at a location spaced apart from the hardware board module 400 or a front surface of the front mechanism 500 by a predetermined height in the hook forming process. Heights of the catching portions 123A and 123B can be set through a method of forming a 3-dimensional shape of the wing portions 120A and 120B, for example, through drawing or embossing in order to enable hook-coupling of the hook 310 and the catching portions 123A and 123B provided in the wing portions 120A and 120B. In particular, when a counterpart of a hook-coupled object is metallic, it is very difficult to engage and disassemble the object. Thus, an auxiliary shape such as a rounded shape or the extraction hole 125A and 125B can be further added to the wing portions 120A and 120B.

The boss 300 can provide a structure by which the bracket 100 can be coupled without forming a screw recess or a screw hole. Additionally, a screw recess 320 or a screw hole can be formed in the boss 300. Boss holes 124A and 124B can be formed in the wing portions 120A and 120B of the bracket 100. The areas of the boss holes 124A and 124B are not less than the area of the boss 300 so that the wing portions 120A and 120B can be inserted into the boss 300. When using a boss, riveting, or welding in addition to the hook-coupling is employed, a shape supporting the coupling method can be formed in the wing portions 120A and 120B of the bracket 100.

The hook 310 of the boss 300 can be formed through injection-molding, casting, or machining such as T-cutting, and a shape of the connecting portion 121 of the bracket 100 is determined according to the shape of the hook 310 of the boss 300. A representative method thereof includes hooking, using a boss, riveting, and welding, and a structure for realizing the method can be included in the boss.

The coupling structure can be applied to various hardware components in addition to a connector included in the electronic device.

FIGS. 6A to 6F illustrate the boss in accordance with the embodiment of the present disclosure in detail.

Figure 6A:
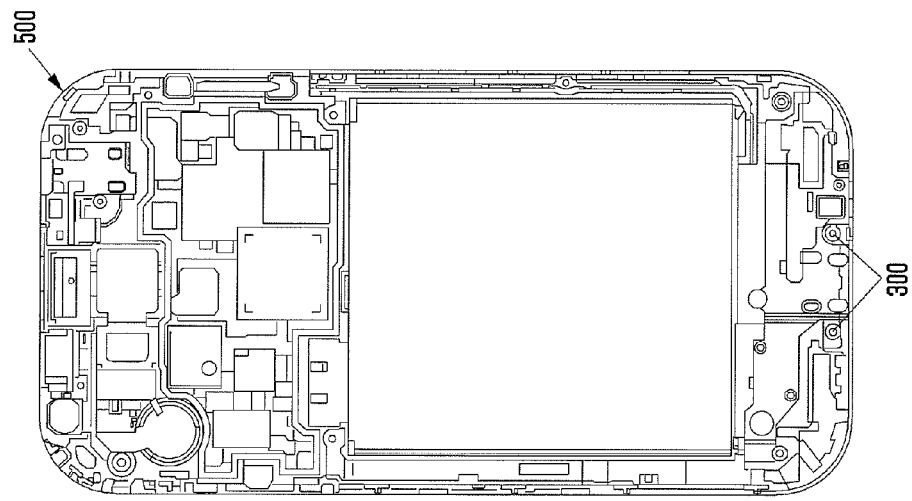
FIGS. 6A to 6F illustrate bosses and their related parts of the front mechanism of FIG. 1 in detail.

First, referring to FIG. 6A, the boss 300 in accordance with the embodiment of the present disclosure can be formed in the front mechanism 500. For example, although two bosses 300 are exemplified, the present disclosure is not limited thereto. That is, the boss 300 can include a greater number of bosses. Although it is exemplified that the boss 300 is disposed at a lower end 520 of the front mechanism 500, the boss 300 can be provided at one periphery of the front mechanism 500 as described above. That is, any boss 300 by which a connector can be disposed can be provided in the front mechanism 500.

Figure 6B:
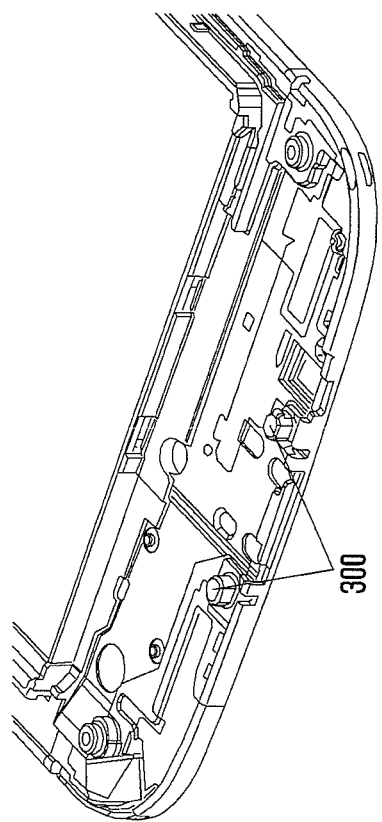
Figure 6C:
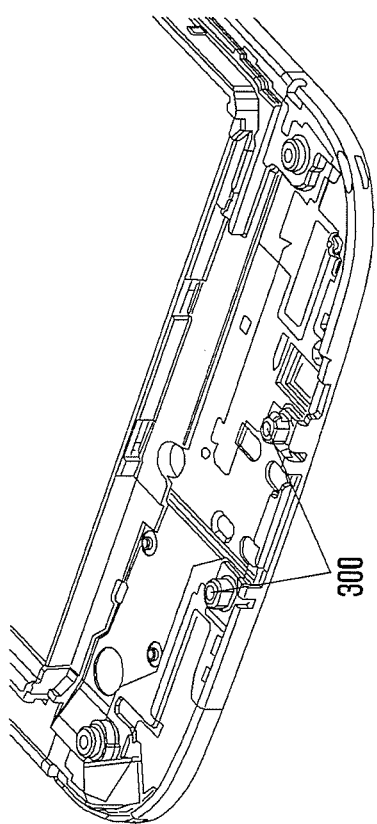
Figure 6D:
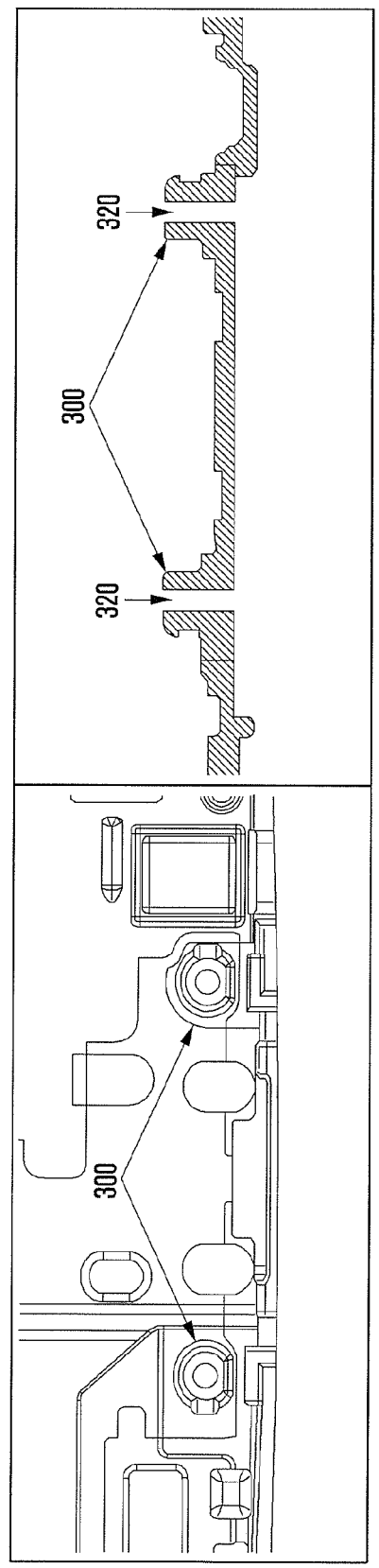
Figure 6E:
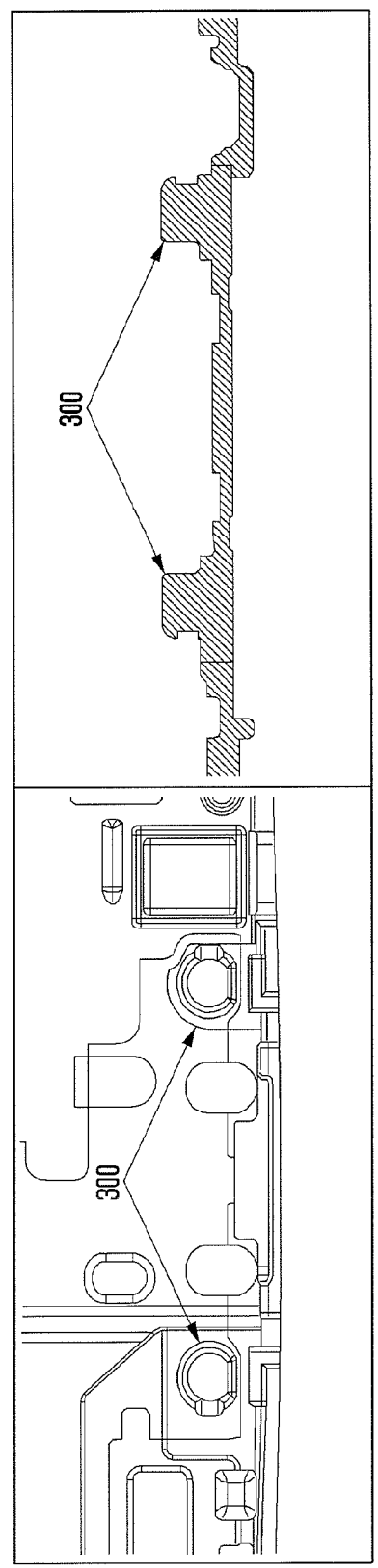

FIGS. 6B to 6E illustrate various shapes of the boss 300 at various angles in the embodiment of the present disclosure. In particular, FIGS. 6B and 6E illustrate the embodiment of the present disclosure in which a separate screw recess is not provided in the boss 300. FIGS. 6C and 6D illustrate another embodiment of the present disclosure in which a screw recess 320 is provided in the boss 300.

Figure 6F:
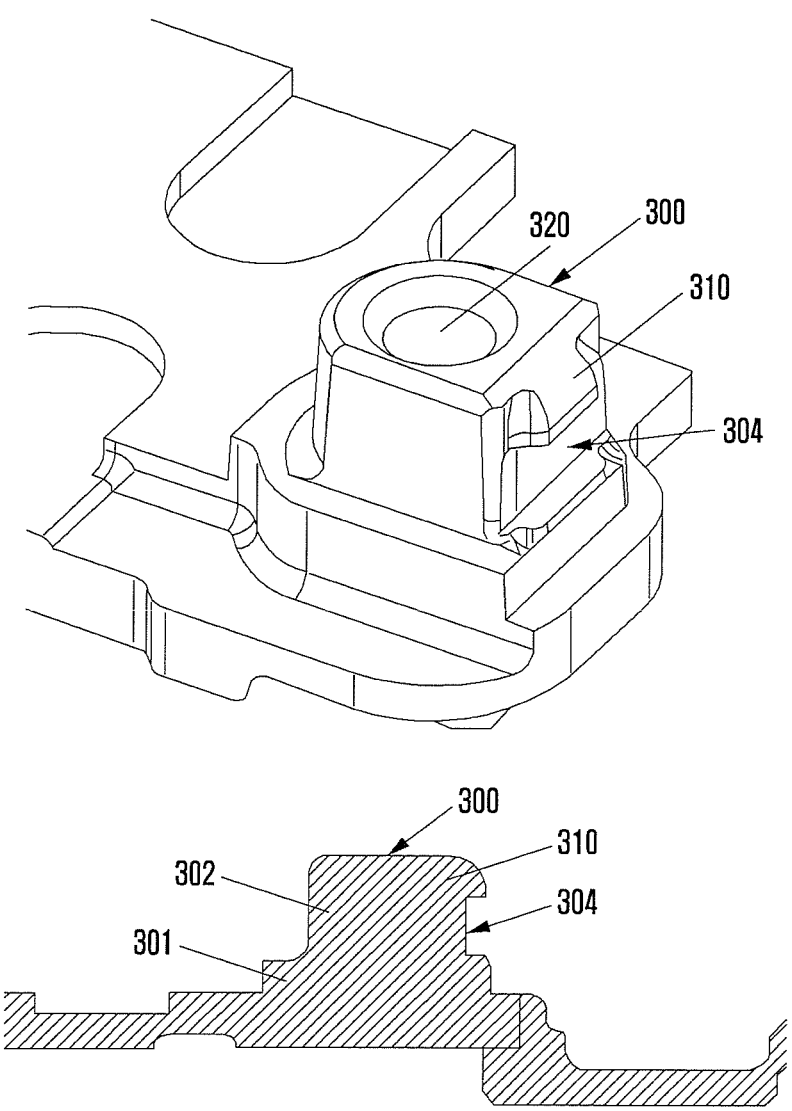

FIG. 6F illustrates enlarged views of one side of the boss 300.

The boss 300 illustrated in FIG. 6F can be one of a plurality of bosses provided at a lower end of the front mechanism 500. The boss 300 can protrude from one surface of the front mechanism 500. As illustrated in the drawing, the boss 300 can include a first portion 301 protruding from one surface of the front mechanism 500 and having a first surface, and a second portion 302 protruding from the first portion 301.

The first portion 301 can protrude from a front surface of the front mechanism 500 to have a predetermined area. A periphery of the first portion 301 can correspond to a shape of the boss hole formed in the bracket 100. In order to firmly fix the bracket 100 after the bracket 100 is positioned in the first portion 301, the periphery of the first portion 301 can have a size similar to that of the boss hole of the bracket 100. Through this, the wing part of the bracket 100 can be interference-fitted with the first portion 301. When the first portion 301 is coupled to the wing part of the bracket 100, a groove by the extraction hole can be disposed between the periphery of the first portion 301 and the wing part. Accordingly, an operator can separate the wing part of the bracket 100 from the first portion 301 by using a tool or his or her hand.

The second portion 302 has a surface smaller than an upper surface of the first portion 301, and can perpendicularly extend from an upper portion of the first portion 301. A separate screw recess 320 can be formed or may not be formed at a center of the second portion 302 according to an intention of a designer. The perspective view illustrates a state in which a screw recess 320 is formed, and the sectional view illustrates a state in which a separate screw recess 320 is not formed. The second portion 302 can have a rectangular horizontal section. The second portion 302 can have a circular horizontal section. The hook 310 can be provided can be provided on a side wall of the second portion 302. The hook 310 can horizontally protrude from a side wall of the second portion 302. An upper end of the hook 310 can be rounded to guide easy insertion of the wing part of the bracket 100. A positioning recess 304 can be defined between the first portion 301 and the second portion 302 by the hook 310. The first connecting portion 11A can be disposed in the positioning recess 304 during insertion of the wing parts 120A and 120B of the bracket 100.

Figure 7A:
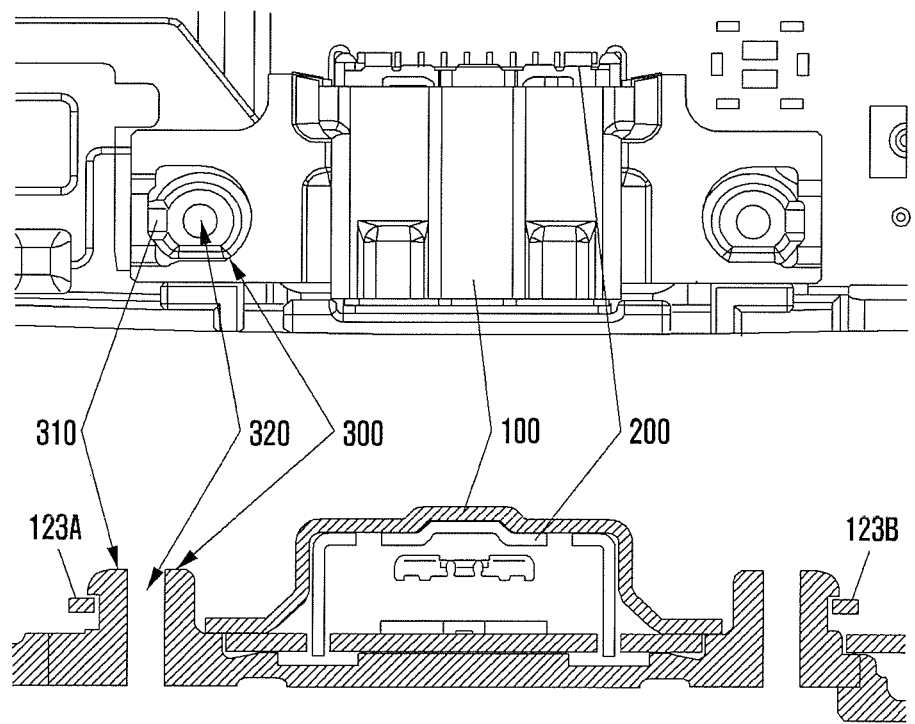
FIGS. 7A and 7B illustrate engaging of the bracket with the boss while covering a connector joint.
Figure 7B:
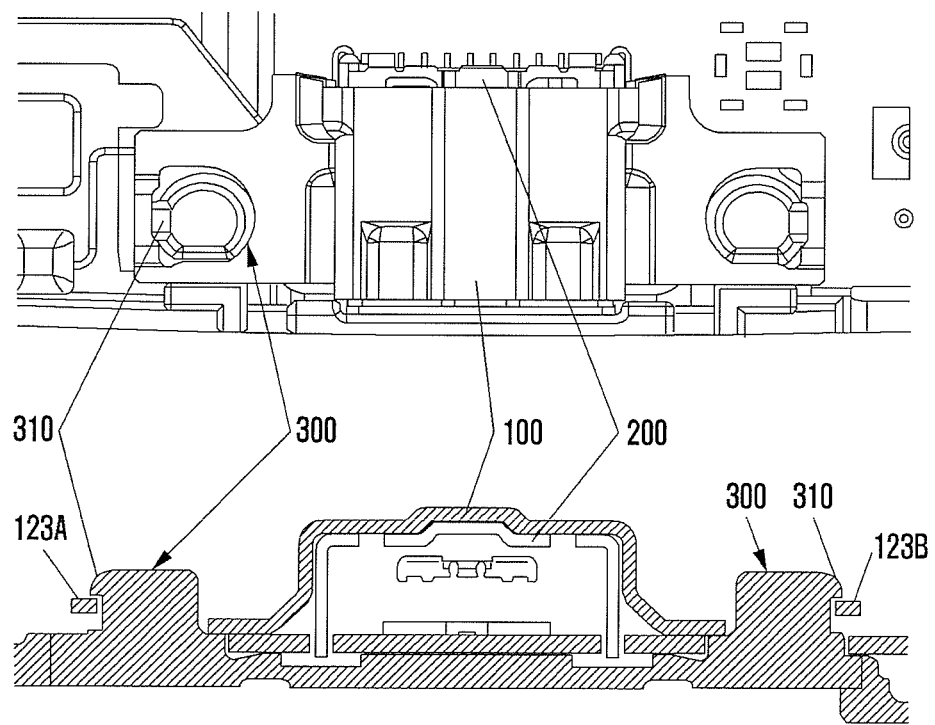

FIGS. 7A and 7B illustrate a structure of the boss with which the bracket is engaged in accordance with embodiments of the present disclosure. In particular, FIG. 7A illustrates a part of a structure related to support of the connector joint of the electronic device employing the boss in accordance with an embodiment of the present disclosure, and FIG. 7B illustrates a part of a structure related to support of the connector joint of the electronic device employing the boss in accordance with another embodiment of the present disclosure.

First, referring to FIG. 7A, the bosses 300 are provided at opposite sides of a lower end of the front mechanism 500 in the electronic device 10. The connector joint 200 can be disposed between the bosses 300. The bracket 100 can be engaged with the bosses 300 while covering the connector joint 200. Screw recess 320 can be provided in the bosses 300 in accordance with the embodiment of the present disclosure. As illustrated in FIGS. 5A to 5C, the bracket 100 can include a cover part 110, column parts 130A and 130B, and wing parts 120A and 120B. In particular, boss holes 124A and 124B can be formed in the wing parts 120A and 120B. Accordingly, the boss holes 124A and 124B provided in the wing parts 120A and 120B can be engaged with the bosses 300 while the bracket 100 covers an upper surface of the connector joint 200. In particular, as described above, hooks 310 can be provided in the bosses 300. Accordingly, the hooks 310 can be hook-coupled to the connecting portions of the wing parts 120A and 120B. Meanwhile, since the first connecting portion 11A is bent and protrudes from the first guide portions 122A of the first wing part 120A, it can provide a resilient force while being supported by the first guide portions 122A. As a result, the first connecting portion 11A is disposed to be pressed vertically downwards by the hook 310 while being engaged with the hook 310, and the first connecting portion 11A can show an upward resilient force. The bracket 100 can firmly support the connector joint 200 even only with a structure in which the bracket 100 is hook-coupled to the boss 300.

As illustrated in FIG. 7A the boss 300 can have a screw recess 320. A screw can be inserted into the screw recess 320. Separate structures of the electronic device 10 such as a rear frame and a battery cover can be further disposed on the bracket 100, and at least one of the structures can be fixed so as to cover the front mechanism 500. Then, the screw structure can be engaged with the boss 300 provided in the front mechanism 500 while passing through the rear frame or the battery cover. As a result, one side of the rear frame or one side of the battery cover can press the bracket 100 towards the front mechanism 500 in the screw-coupling process. Accordingly, the bracket 100 can support the connector joint 200 more firmly.

Meanwhile, although it has been exemplified that a screw is coupled to the screw recess 320 through the rear frame or the battery cover, the screw can be directly inserted into the screw recess 320 without using a separate rear frame or battery cover. In this case, the screw screw-coupled to the screw recess 320 can be a specially manufactured screw. For example, the screw screw-coupled to the screw recess 320 can be a screw manufactured to press the bracket 100 towards the front mechanism 500 while being screw-coupled to the screw recess 320. A resilient member or a metal member connecting the screws inserted into the screw recess 320 can be provided in the bosses 300. The resilient member or the metal member can be disposed on an upper surface of the bracket 100 and fixed to the screw recess 320 of the bosses 300.

Meanwhile, FIG. 7B illustrates a part of the electronic device employing a boss in accordance with another embodiment of the present disclosure. In particular, the boss 300 illustrated in FIG. 7B may not employ a screw recess. As illustrated, the boss 300 can have a first portion 301 and a second portion 302, and a hook 310 can be provided on a side wall of the second portion 302 parallel to the side wall. The wing parts 120A and 120B of the bracket 100 can be fixed to the hook 310. Here, one side of the wing parts can correspond to the first connecting portion 11A or the second connecting portion 11B.

Figure 8:
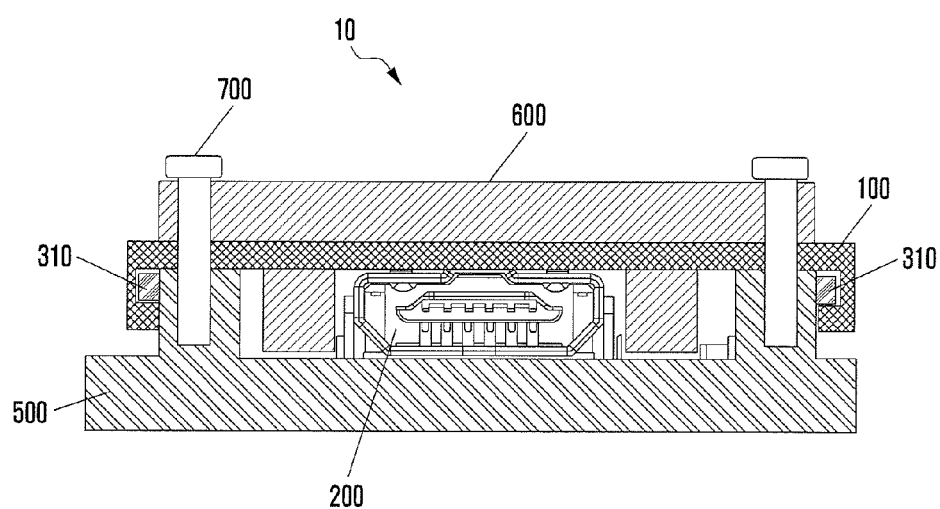
FIG. 8 illustrates another configuration of the electronic device to which a connector joint support module in accordance with the embodiment of the present disclosure is applied.

FIG. 8 illustrates a configuration related to support of the connector joint of the electronic device in accordance with another embodiment of the present disclosure.

Referring to FIG. 8, the electronic device 10 supporting the connector joint 200 in accordance with the other embodiment of the present disclosure can include a connector joint support module including a portion of the front mechanism 500 at which the boss 300 is formed, a portion of the printed circuit board 410 at which the connector joint 200 is disposed, the bracket 100, an antenna carrier or the rear frame 600, and a screw 700. Hereinafter, reference numeral 600 denotes the antenna carrier. However, reference numeral 600 can denote a rear frame according to disposition or change of design thereof.

The connector joint support module can be defined to include the bosses 300, the connector joint 200, and the bracket 100. For example, although the connector joint support structure has been described as a form in which the bosses 300 are formed in the front mechanism 500, the bosses 300 can be formed in the printed circuit board 410 according to change of design thereof. The connector joint support module can be configured by separately manufacturing a structure including the bosses 300 and coupling the structure to the front mechanism 500. Although it has been described that the connector joint 200 is disposed on the printed circuit board 410, the present disclosure is not limited thereto. For example, the connector joint 200 can be directly disposed in the front mechanism 500, or can be disposed between the bosses 300 corresponding to the connector joint 200 in the process of providing the bosses as separate structures. Accordingly, it can be understood that the connector joint support module according to the present disclosure basically includes the bosses 300, the connector joint 200, and the bracket 100. Further, it can be understood that the components can be formed in various structures included in the electronic device 10 or can be disposed in a separate structure for support of the connector joint.

The electronic device 10 can employ a structure in which the bracket 100 primarily supports the connector joint 200, the antenna carrier 600 is disposed on an upper surface of the bracket 100, and the antenna carrier 600 is screw-coupled to the bracket 100 to press the bracket 100. Accordingly, the electronic device 10 in accordance with the embodiment of the present disclosure provides a base for support of the complex connector joint 200 to have a high resistance to movement of the connector joint 200 and damage to the connector during an insertion process of the connector.

As illustrated in the drawings, the boss 300 can be disposed at a periphery of the front mechanism 500 of the electronic device 10. In this case, a plurality of bosses 300 can be provided. In particular, since the connector joint 200 is disposed between the plurality of bosses 300, two or more bosses can be provided. The bosses 300 can be spaced apart from each other by a separation larger than a length of the connector joint 200 for disposition of the connector joint 200. It has been exemplified that two bosses 300 are disposed in the embodiment of the present disclosure, and a boss can be provided on a rear side of the connector joint 200 in addition to the two bosses disposed at opposite sides of the connector joint 200.

When a boss is provided on the rear side of the connector joint 200, a higher resistance to movement of or damage to the connector joint 200 due to a physical force applied when the connector is inserted into the connector joint 200 can be secured. Since a force is applied in a predetermined direction while the connector is inserted into the connector joint 200, the connector joint 200 can be separated from the printed circuit board 410 or damaged. In accordance with the embodiment of the present disclosure such separation of or damage to the connector joint 200 can be minimized when a screw-coupling structure based on the bracket 100 and the antenna carrier 600 is employed as in the embodiment of the present disclosure.

The printed circuit board 410 can has various circuits and elements for supporting electrical connection to the connector when the connector is inserted into the connector joint 200. The printed circuit board 410 can be formed of wood or a dielectric material, and can be connected to a main printed circuit board disposed at an upper end of the front mechanism 500. When the antenna carrier 600 is disposed at a lower end of the front mechanism 500, a signal pattern electrically connected to the antenna carrier 600 can be provided in the printed circuit board 410. The printed circuit board 410 can serve to transfer signals for management of an antenna disposed in the antenna carrier 600 to the main printed circuit board.

An antenna for supporting a communication function of the electronic device 10 can be disposed in the antenna carrier 600. The antenna carrier 600 can be formed of a nonmetallic material, for example, a plastic material. The antenna carrier 600 in accordance with the embodiment of the present disclosure can be screw-coupled to the screw recess 320 of the bosses 300 to support the bracket 100. Thereto, a plurality of screw holes into which screws 700 can be inserted can be provided in the antenna carrier 600. The structure of the antenna carrier 600 can be variously changed according to a structure of the front mechanism 500 or the rear frame of the electronic device 10. The embodiment of the present disclosure is not limited to the structure or shape of the antenna carrier 600. That is, the antenna carrier 600 in accordance with the embodiment of the present disclosure can include screw holes for screw-coupling to the boss 300.

As described above, the boss 300 can have the hook 310 protruding from a side wall thereof and the bracket 100 can have the first connecting portion 11A engaged with the hook 310. The structure of the bracket 100 illustrated in FIG. 8 is a cover-shaped structure and is somewhat different from the above-described structure. The bracket 100 has the first connecting portions 11A at opposite peripheries thereof such that the first connecting portions 11A are engaged with the hook 310. Accordingly, a central portion of the bracket 100 can press an upper surface of the connector joint 200.

Although the antenna carrier 600 has been described until now, the antenna carrier 600 can be replaced by a rear frame or a battery cover as mentioned above. The battery cover can be a detachable or non-detachable one. Since the battery cover may not be easily detached in a structure in which the connector joint 200 is fixed through screw-coupling as in the embodiment of the present disclosure, it can be preferable that a non-detachable battery cover is applied. The electronic device 10 having a non-detachable battery cover can be designed to have an embedded battery.

As described above, since the connector joint 200 is stably fixed to the front mechanism 500 in the electronic device in accordance with the embodiment of the present disclosure, the connector joint 200 can be fixed in a process of manufacturing a product so that the connector joint 200 cannot be separated from the printed circuit board 410. The bracket 100 for fixing the connector joint 200 also can fix one side of the printed circuit board 410 to the front mechanism 500. In addition, the structure for screw-coupling of the bracket 100 can firmly attach the boss 300 provided in the front mechanism 500 and other structures, for example, the antenna carrier 600, the rear frame, or the battery cover to the front mechanism 500. The present disclosure can prevent loss of components in the process of manufacturing a product and increase strength of the manufactured product, thereby increasing reliability of the product.

Further, the present disclosure provides an extraction hole at one side of the bracket 100 to separate the bracket 100 from the bosses 300 more easily. Accordingly, the present disclosure can provide an easy separation function in the process of compensating or repairing a structure such as the connector joint 200, the front mechanism 500, or the printed circuit board 410.

The shape of the boss 300 applied to the present disclosure can be realized through a mold. The boss 300 forms an undercut structure to form the hook 310 by applying machining such as T-cutting. In the bracket 100 applied to the present disclosure, since the first connecting portion 11A is formed by adding a 3-dimensional forming process such as drawing or embossing, a structure that can be caught by the hook 310 can be formed. The electronic device 10 in accordance with the embodiment of the present disclosure can perfectly support Z-direction fixing irrespective of screw-coupling through fixing of the boss 300 and the bracket 100.

The bracket 100 in accordance with the embodiment of the present disclosure has a thin plate shape enclosing the connector joint 200 to minimize a peripheral space of the boss 300 of the front mechanism 500. Accordingly, the electronic device 100 of the embodiment of the present disclosure can realize performance of an antenna and prevent separation of a connector while occupying a small space. Since the electronic device 10 employing the bracket 100 in accordance with the embodiment of the present disclosure covers the connector joint, strength to resist an external impact can be secured. Further, since a separate bracket is primarily assembled in a hooked manner to fix the connector joint on the hardware board module, loss of a product due to separation of the connector joint can be reduced, which increases productivity. In the electronic device 10 in accordance with the embodiment of the present disclosure, an extraction hole is applied to a separate bracket so that the bracket can be easily assembled and disassembled and a service can be improved.

Figure 9:
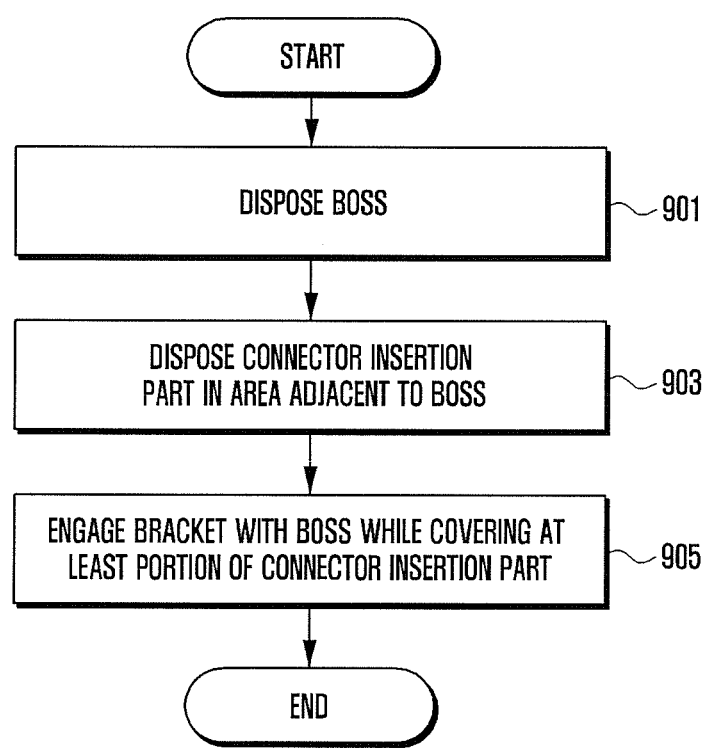
FIG. 9 illustrates a method of assembling a connector joint support module in accordance with an embodiment of the present disclosure.

FIG. 9 illustrates a method of assembling an electronic device including a connector joint support module in the connector joint support structure in accordance with an embodiment of the present disclosure.

Referring to FIG. 9, the method of assembling an electronic device in accordance with the embodiment of the present disclosure can include an operation 901 disposing the boss 300 having at least one projection, an operation 903 of disposing the connector joint 200 in an area adjacent to the boss 300, and an operation 905 of engaging the bracket 100 with the boss 300 while covering at least a portion, for example, an upper portion, of the connector joint 200 with the bracket 100. Here, a plurality of projections instead of one projection can be provided in the boss 300. Two projections are illustrated in the embodiment, but three or more projections can be applied to the present disclosure. The boss 300 can be provided as a component of the front mechanism 500. However, as described above, if the boss 300 is provided as a separate structure, it can be formed in another structure, for example, the printed circuit board 410, the rear frame, or the antenna carrier 600.

The boss 300 has a hook to be engaged with the bracket 100, but the present disclosure is not limited thereto. For example, the boss 300 can have a projection without employing a separate hook. In response thereto, the bracket 100 can have a recess so that the projection is interference-fitted with the recess to fix the connector joint 200. The recess can be coupled to the projection of the boss 300 in a snap button manner. Even if the boss 300 has a recess and the bracket 100 has a projection, they can be coupled to each other in a snap button manner. A snap button recess can be formed in one of the boss 300 and the bracket 100, and a snap button projection can be formed in one of the bracket 100 and the boss 300 in response.

When the bracket 100 and the boss 300 are coupled to each other in a snap button manner, a periphery of a wing part of the bracket 100 can be separated from the boss 300 when coupled to the boss 300 so that the wing part of the bracket 100 can be easily separated from the boss 300. For example, a periphery of the wing part of the bracket 100 can be stepped. Accordingly, when the bracket 100 and the boss 300 are coupled to each other in a snap button manner in the connector joint support module of the present disclosure and then the bracket 100 is to be disassembled, a tool can be inserted into the step spaced apart from the boss 300 or a fingernail of an operator can be used to easily separate the bracket 100.

Although it has been described that the boss 300 has a projection and a hook is provided at an upper end of the boss 300, the connector joint support module of the present disclosure is not limited thereto. That is, the boss 300 is spaced apart from a surface of the front mechanism 500 by a predetermined height, but can have a hook or a plate-shaped hook. The bracket 100 of the present disclosure can have a thin plate-shaped wing part in which a separate boss hole is not formed. Then, the bracket 100 can be inserted into and fixed to the boss 300 by pushing a plate-shaped wing part from an opening of the hook-shaped boss 300 toward an interior of the hook. In this process, at least a portion of an inner ceiling of the cover of the bracket 100 can contact an upper surface of the connector joint 200 while being positioned on an upper surface of the connector joint 200 and inserted into the boss 300.

In the connector joint support module in accordance with the embodiment of the present disclosure, in addition to the hook coupling structure, the connector joint 200 can be disposed between the bosses 300 and the bracket 100 can be engaged with the bosses 300 in a snap button manner, or a hook or a plate is disposed above a surface of the front mechanism 500 at a predetermined height and the plate is inserted in a sliding manner, so that a least a portion of the connector joint 200 is fixed while the bracket 100 is engaged with the boss 300. That is, considering productivity and stability, the bosses 300 and the bracket 100 can be engaged with each other in various fitting methods in the connector joint support module in accordance with various embodiments of the present disclosure. Meanwhile, when the connector joint 200 is mounted to the hardware board module and is disposed between the bosses 300, the bracket 100 can have a height such that the connector joint 200 can be pressed, considering a thickness of the hardware board module.

Further, in the connector joint support module in accordance with the embodiment of the present disclosure, a recess is provided in the boss 300 in a rail/groove insertion method and a projection can be provided in the wing part of the bracket 100. In the connector joint support module, the projection of the bracket 100 can be inserted into the rail groove and can be moved to fixedly insert the bosses 300 into the bracket 100. A lengthwise groove is provided in the boss 300 for the rail/groove insertion method, and one end of the groove can be larger than a width of the rail. An upper end of the projection of the bracket 100 can be inserted into the groove larger than a width of the rail. The projection of the bracket 100 can have a shape in which a sphere is connected to an end of a cylinder. In the process of fitting the bracket 100 with the boss 300, a sphere of the projection of the bracket 100 is inserted into the rail so that it can move in the rail, and the cylinder is moved outside the rail to be fixed.

Figure 10:
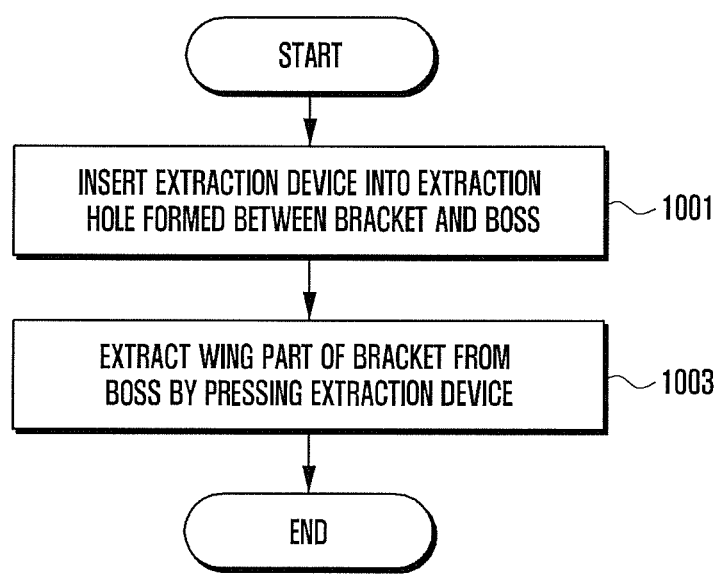
FIG. 10 illustrates a method of disassembling a connector joint support module in accordance with an embodiment of the present disclosure.

FIG. 10 illustrates a method of disassembling an electronic device including a connector joint support module in a connector joint support structure in accordance with an embodiment of the present disclosure.

Referring to FIG. 10, the method of disassembling an electronic device in accordance with the embodiment of the present disclosure can include an operation 1001 of inserting an extraction device into an extraction hole formed between the bracket 100 and the boss 300, and an operation 1003 of extracting a wing part of the bracket 100 from the projection of the boss 300 by using an extraction recess formed in the wing part of the bracket 100. The extraction device can include a tool in the form of a separate lever, and a finger or a fingernail of an operator. Further, the extraction device can be a tweezer. The structure of the extraction hole can be applied to a state in which the boss 300 is hook-coupled to the bracket 100.

When the boss 300 and the bracket 100 are coupled to each other in a snap button manner, the extraction device can be inserted into the step of the bracket 100 that is separated from the boss 300 and the bracket 100, instead of into the extraction hole. Then, the bracket 100 engaged with the step in a snap button manner through pressing by a lever principle can be extracted from the boss 300.

When the connector joint support module of the present disclosure employs a method of pushing a wing part of the bracket 100 into a hook-shaped aperture or a rail/groove insertion method, an operator can separate the bracket 100 from the boss 300 by pushing the bracket 100 in a direction opposite to the coupling direction without using a separate extraction device. Then, the bracket 100 can be separated from the boss 300 according to a physical force applied to a side or upper surface of the column part or the wing part of the bracket in a direction opposite to the coupling direction.

Meanwhile, the electric device 10 can further include various additional modules according to the form thereof. That is, when the electric device 10 is a communication electronic device, it can further include unmentioned constituent elements such as a near field communication module for near field communication, an interface for transmission and reception of data through a wired communication method or a wireless communication method of the electric device 10, an Internet communication module for communicating with the Internet network to perform an Internet function, and a digital broadcasting module for receiving and reproducing digital broadcasts. Although the constituent elements can be so variously adapted that all of them cannot be enumerated due to a trend of digital convergence, constituent elements corresponding to the above-mentioned constituent elements can be additionally included in the device. It is apparent that some constituent elements can be excluded from the electric device 10 in accordance with the embodiment of the present disclosure or can be replaced by other constituent elements according to a form thereof. This will be easily understood by those skilled in the art to which the present disclosure pertains.

Further, the terminal device 100 in accordance with the embodiment of the present disclosure can include all information communication devices, multimedia devices, and application devices thereof, such as a Portable Multimedia Player (PMP), a digital broadcasting player, a Personal Digital Assistant (PDA), a music reproducer (for example, an MP3 player), a portable game terminal, a smart phone, a laptop computer, and a handheld PC, including all mobile communication terminals operated based on communication protocols corresponding to various communication systems.

The present disclosure is not limited to the embodiments and the drawings, but it is apparent to those skilled in the art to which the present disclosure pertains that the present disclosure can be variously substituted, modified, and changed without departing from the scope of the present disclosure.

As described above, in accordance with the present disclosure, an improved connector joint structure can be achieved.

For example, the present disclosure can reinforce a disposition of a connector joint for connection of a USB charging terminal, a cable, or other external devices.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A connector joint support module comprising:
  a boss including at least one projection;
  a connector joint disposed in an area adjacent to the boss; and
  a bracket disposed to be engaged with the boss and cover at least a portion of the connector joint, wherein the boss includes a first portion protruding and having a predetermined surface, and a second portion protruding from the first portion, wherein a hook is provided on a side wall of the second portion,
    wherein the connector joint includes at least one of a rail groove in a ceiling area of the connector joint, the bracket includes at least one of a rail that is coupled to the at least one of the rail groove so that the connector joint is more firmly retained on a printed circuit board or a front mechanism, and
    wherein the bracket supports the connector joint, an antenna carrier is disposed on an upper surface of the bracket, the antenna carrier is screw coupled to the bracket to press the bracket, and the antenna carrier is screw coupled to a screw recess of the boss to support the bracket.

2. The connector joint support module of claim 1, wherein the bracket comprises:
  a cover part to cover the at least the portion of the connector joint;
  column parts to support the cover part; and
  wing parts connected to the column parts and engaged with the boss.

3. The connector joint support module of claim 2, wherein each of the wing parts comprises:
  a boss hole to which the boss is inserted; and
  a catching portion hook-coupled to a hook included at one side of the boss.

4. The connector joint support module of claim 3, wherein the wing part further comprises an extraction hole included in a peripheral area of the boss hole.

5. The connector joint support module of claim 1, wherein at least one of the boss or the bracket is formed of a metallic material.

6. The connector joint support module of claim 1, wherein one of the boss and the bracket comprises a snap button recess, and the other thereof comprises a snap button projection.

7. The connector joint support module of claim 6, wherein the bracket comprises a step disposed such that a periphery area of the step is separated from the boss.

8. The connector joint support module of claim 1, wherein the boss includes a hook shape and the bracket comprises a wing part slid into an aperture of the hook-shaped boss to be engaged with the boss while covering the at least the portion of the connector joint.

9. An electronic device comprising:
  a boss including at least one projection;
  a connector joint disposed in an area adjacent to the boss;
  a bracket disposed to be engaged with the boss and to cover at least a portion of the connector joint;

a screw recess formed in a female screw shape at a center of the projection of the boss;
at least one of an antenna carrier or a rear frame disposed to enclose the bracket; and
at least one of a screw passing through one side of the antenna carrier or the rear frame and engaged with the screw recess of the boss, wherein the boss includes a first portion protruding and a predetermined surface, and a second portion protruding from the first portion, wherein a hook is provided on a side wall of the second portion and wing parts of the bracket are fixed to the hook,
wherein the connector joint includes at least one of a rail groove in a ceiling area of the connector joint, the bracket includes at least one of a rail that is coupled to the at least one of the rail groove so that the connector joint is more firmly retained on a printed circuit board or a front mechanism, and
wherein the bracket supports the connector joint, the antenna carrier is disposed on an upper surface of the bracket, the antenna carrier is screw coupled to the bracket to press the bracket, and the antenna carrier is screw coupled to the screw recess of the boss to support the bracket.

10. The electronic device of claim 9, further comprising at least one of a front mechanism or a hardware board module in which the boss is formed.

11. The electronic device of claim 9, further comprising at least one of a hardware board module or a front mechanism in which the connector joint is disposed.

12. The electronic device of claim 9, wherein the connector joint includes a USB connector joint.

13. The electronic device of claim 9, wherein one of the boss or the bracket comprises a snap button recess and the other thereof comprises a snap button boss, and wherein the bracket includes a step disposed such that a peripheral area of the bracket is separated from the boss.

14. The electronic device of claim 9, wherein the boss includes a hook shape and the bracket comprises a wing part slid into an aperture of the hook-shaped boss to be engaged with the boss while covering at least a portion of the connector joint.

15. A method of assembling an electronic device, the method comprising:
disposing at least one boss;
disposing a connector joint in a peripheral area of the boss; and
engaging a bracket with the boss while covering at least a portion of the connector joint with the bracket,
wherein the boss includes a first portion protruding and a predetermined surface, and a second portion protruding from the first portion, wherein a hook is provided on a side wall of the second portion,
wherein the connector joint includes at least one of a rail groove in a ceiling area of the connector joint, the bracket includes at least one of a rail that is coupled to the at least one of the rail groove so that the connector joint is more firmly retained on a printed circuit board or a front mechanism, and
wherein the bracket supports the connector joint, an antenna carrier is disposed on an upper surface of the bracket, the antenna carrier is screw coupled to the bracket to press the bracket, and the antenna carrier is screw coupled to a screw recess of the boss to support the bracket.

16. The method of claim 15, wherein engaging the bracket includes a hook-coupling the bracket with the hook included in the boss.

17. The method of claim 15, wherein engaging the bracket further comprises engaging the bracket with the boss through a snap button insertion method.

18. A method of disassembling an electronic device, the method comprising:
disposing at least one boss;
disposing a connector joint in a peripheral area of the boss;
engaging a bracket with a hook included in the boss through hook-coupling while covering at least a portion of the connector joint with the bracket; and
removing a wing part of the bracket from the hook of the boss by using an extraction hole formed in the bracket, wherein the boss includes a first portion protruding and a predetermined surface, and a second portion protruding from the first portion, wherein a hook is provided on a side wall of the second portion,
wherein the connector joint includes at least one of a rail groove in a ceiling area of the connector joint, the bracket includes at least one of a rail that is coupled to the at least one of the rail groove so that the connector joint is more firmly retained on a printed circuit board or a front mechanism, and
wherein the bracket supports the connector joint, an antenna carrier is disposed on an upper surface of the bracket, the antenna carrier is screw coupled to the bracket to press the bracket, and the antenna carrier is screw coupled to a screw recess of the boss to support the bracket.

* * * * *